United States Patent

Kadomura

[11] Patent Number: 5,227,337
[45] Date of Patent: Jul. 13, 1993

[54] INTERCONNECTION FORMING METHOD
[75] Inventor: Shingo Kadomura, Kanagawa, Japan
[73] Assignee: Sony Corporation, Tokyo, Japan
[21] Appl. No.: 832,580
[22] Filed: Feb. 7, 1992
[30] Foreign Application Priority Data Feb. 8, 1991 [JP] Japan .................... 3-060906

[51] Int. Cl.$^5$ ........................... H01L 21/283
[52] U.S. Cl. ................... 437/192; 437/228; 156/345; 156/643; 156/646; 156/656
[58] Field of Search ............... 437/192, 228; 156/345, 156/643, 646, 656

[56] References Cited

U.S. PATENT DOCUMENTS

| | | | |
|---|---|---|---|
| 4,936,950 | 6/1990 | Doan et al. | 156/643 |
| 4,948,462 | 8/1990 | Rossen | 156/643 |
| 4,981,550 | 1/1991 | Huttemann et al. | 156/643 |
| 5,035,768 | 7/1991 | Mu et al. | 156/659.1 |
| 5,164,330 | 11/1992 | Davis et al. | 437/192 |

Primary Examiner—T. N. Quach
Attorney, Agent, or Firm—Hill, Steadman & Simpson

[57] ABSTRACT

There is proposed a method of carrying out etch-back of a tungsten layer (Blk-W layer) formed by the blanket CVD process while suppressing the loading effect by using a small system. The etch-back process is divided into a high temperature process for removing about 90% of the film thickness of the Blk-W layer, and a low temperature process for removing the remainder. Switching between wafer temperatures at the both processes is carried out by upper and lower movement of pins included in a wafer mount electrode. If the wafer is held on the wafer mount electrode in a manner to be in contact therewith, cooling can be carried out. Further, if the wafer is held on the wafer mount electrode in the state spaced therefrom, heating by plasma radiation heat can be carried out. In the high temperature process, $S_2F_2$ gas is used to carry out high speed etching by F*. On the other hand, in the low temperature process, $S_2F_2/H_2$ mixed gas is used to deposit S dissociated and formed from $S_2F_2$ on the surface of the Blk-W layer. Here, $H_2$ has the effect to form H* to capture excessive F*, thus to promote deposition of S dissociated and formed from $S_2F_2$. As the result of the fact that sputter removal of S and etching reaction are competitive, the etchrate of the Blk-W layer is lowered.

4 Claims, 3 Drawing Sheets

INTERCONNECTION FORMING METHOD

BACKGROUND OF THE INVENTION

1. Field of the Invention

This invention relates to an interconnection forming method applied in the manufacturing field of a semiconductor device, etc., and more particularly to a method for carrying out etch-back of a refractory metal layer formed by the so-called blanket CVD process by using a small system while suppressing the loading effect.

2. Description of the Prior Art

As found in recent VLSI or ULSI, etc., there is a tendency such that the ratio occupied by the interconnecting portion on a device chip increases in accordance with development of high integration and high performance of semiconductor devices. In order to prevent a chip area from being increasing to much degree, multilevel interconnection has been now an essential or indispensable technology. Hitherto, as the interconnection forming method, it has been carried out to form a metal thin film comprised of aluminum, etc. by using the sputtering process. However, under the circumstances where multilevel interconnection has been developed as described above, so a surface step of a substrate body or an aspect ratio of a through hole increases, unsatisfactory connection between an upper metallization layer and the semiconductor substrate and/or unsatisfactory connection between metallization layers have been already serious problem because of insufficient step coverage in the sputtering process.

In view of this, there has been recently proposed a technology to selectively grow refractory metal such as tungsten (W), molybdenum (Mo), tantalum (Ta), or titanium (Ti), etc., or metal such as aluminum or copper, etc. in a through hole to thereby fill or bury a through hole of high aspect ratio with such metal. As a technique of such a selective growth, the selective CVD process to reduce gas such as metal fluoride or organometallic compound, etc. by a lower conductive material to deposit metal is the representative thereof.

However, while the selective CVD process can provide considerably satisfactory results at the level of study, it has the drawbacks that selectivity is degraded with lapse of time, that controllability in removing etch-back of an overgrowth section ordinarily called a nail head is poor, and the like. Contrary to expectation at the beginning, it is thus the present state that no clear view of situation of introduction to mass production is formed.

In place of this selective CVD, attention has again been drawn to the blanket CVD process. This blanket CVD process is a technology to deposit metal or alloy on the entire surface of a substrate body. As the representative of this blanket CVD process, there is known a process to coat the entire surface of, e.g., an insulating film in which a through hole is opened to form a refractory metal layer such as W, etc. in such a manner that the through hole is filled or buried.

Meanwhile, in the case of allow the refractory metal layer to be buried into the through hole to use it as the so-called plug, etch-back of the refractory metal layer is required as a matter of course. At this etch-back process, over etching of about 5 to 10% is ordinarily carried out by taking into consideration uniformness of the processing in the wafer plane. However, it is to be noted that etchrates at respective portions in a single wafer plane would be generally diverse. Namely, at the portion close to the region having a relatively high plasma density within an etching system, an etchrate thereof is higher than those at portions except for the above. For this reason, a sudden decrease in the area subject to etching followed by exposure of the interlayer insulating film takes place at an early stage of the etch-back process. This results in the problem that etchants which have been relatively excessive as the result of the fact that an object to be bonded (i.e., refractory metal) is lost concentrate on the internal portion of the through hole, and greatly erode the refractory metal layer buried therein.

Let now consider the case where, for example, as shown in FIG. 1a, an interlayer insulating film 2 having a through hole 3 opened is formed on a semiconductor substrate 1, and a Blk-W layer 4 formed by the blanket CVD process is deposited in a manner to coat the entire surface of the interlayer insulating film 2. When it is now assumed that the Blk-W layer 4 is etched back by using fluorine gas, $F^*$ (fluorine radical) becomes surplus or excessive in the vicinity of the region having high plasma density at an early time at the stage where the surface of the interlayer insulating film 2 is exposed. For this reason, such $F^*$ concentrates on the surface of the Blk-W layer 4 buried in the through hole 3, so a large eroded portion 5 as shown in FIG. 1b would be formed while over etching is carried out.

This is a phenomenon called a loading effect. Such a phenomenon is the cause to substantially prevent the blanket CVD process from being put into practice. In the manufacturing field of future semiconductor devices, since it is expected that the diameter of the wafer will be enlarged according as the device chip becomes large, and a single wafer etching system for carrying out etching at a high rate by using high density plasma in order not to lower the throughput will becomes the main current, it is considered that the loading effect becomes more conspicuous. Accordingly, it is required to take an early measure to solve the above problems.

As the measure which can solve the above problems, it is conceivable to carry out etch-back of a refractory metal layer until the insulating film is exposed in the state where a wafer is caused to be held at a high temperature to allow the etchrate to be high, and to further carry out over etching subsequent thereto in the state where that wafer is caused to be held at a low temperature to allow the etchrate to be low. However, when an attempt is made to carry out such two-stage process by the existing etching system, an etching chamber for high temperature process and an etching chamber for low temperature process are separately required. As a result, there are the problems that the running cost of the system is increased, and that the occupation space of the system within a clean room is increased, resulting in an increased maintenance expense of the clean zone, etc. In addition, it is apprehended that the throughput is lowered by conveyance between chambers, or opportunity of contamination or pollution is increased.

OBJECT AND SUMMARY OF THE INVENTION

With the above actual circumstances in view, an object of this invention is to provide a method of carrying out etch-back of a refractory metal film formed by the blanket CVD process by using a small etching system without undergoing the influence of the loading effect.

In the process of energetically conducting studies in order to achieve the above-described object, the inventor of this invention hitted upon a plan such that while following the scheme to carry out etch-back of a refractory metal layer formed by the blanket CVD process by a two-stage process in which the high temperature process and the low temperature process are combined, improvement is made so that there results a process which can carry out such a two-stage process within a single etching chamber.

In order to carry out this technology, it is the premise as a matter of course that a mechanism permitting a wafer to be quickly heated and cooled is provided in the etching system. The applicant of this application has already disclosed an example of an actual measure for the above in the publication of the Japanese Patent Laid Open Application No. 283613/91. The system disclosed in this publication is an etching system provided with cooling means and movement means for moving a wafer in upper and lower directions on a wafer stage. Namely, if a wafer is caused to be held on the wafer stage cooled in advance in a manner in contact therewith, the low temperature process can be carried out. On the other hand, if the movement means is caused to be driven to hold the wafer in the state where it is spaced from the wafer stage, the wafer is isolated from cooling of the wafer stage, and is quickly subjected to temperature elevation by the plasma radiation heat and the etching reaction heat. Thus, the high temperature process can be carried out.

In this invention, in connection with the case where the above-mentioned refractory metal layer is particularly the tungsten layer or the molybdenum layer, an etching gas composition effective and excellent in controllability is further proposed. Namely, initially, at the first etch-back process step, an etching gas including at least one of five kinds of sulfur fluoride of $S_2F_2$, $SF_2$ $SF_4$, $S_2F_{10}$ and $SF_6$ is used to carry out etch-back of the refractory metal layer immediately before the insulating layer is exposed. In this process step, $F^*$ produced in plasma by discharge dissociation of sulfur fluoride takes or shows radical reaction. Further, this radical reaction is assisted by an incident energy of ion such as $SF_x{}^+$ or $S_x{}^+$, etc. Thus, the refractory metal is rapidly removed in the form of fluoride.

In the subsequent second etch-back process step, the wafer is cooled, and at least one of $H_2$, $H_2S$ and silane compound is added to the above-mentioned etching gas to etch-back the remainder of the refractory metal layer. It is to be noted that $SF_6$ of the above-mentioned sulfur fluoride is not used here. This is because it was confirmed by other experiments conducted by the inventor that $SF_6$ hardly forms or produces free S in plasma even by discharge dissociation. Four kinds of sulfur fluoride except for $SF_6$ can all form free S in plasma thus formed will be deposited on the wafer because the wafer is cooled. On the other hand, etching of the refractory metal layer is also developed by action of $F^*$, etc. Namely, on the surface of the refractory metal layer, deposition of S and spattering removal thereof, and etching of the refractory metal layer competitively proceed.

Further, in the second etch-back process step, compound consisting of hydrogen and/or silicon is added to the etching gas. The reason why such additive processing is conducted is as follows. Namely, in order to further effectively carry out deposition of S as described above, such additive processing helps to capture excessive $F^*$ formed from sulfur fluoride to increase apparent S/F ratio (ratio between the number of S atoms and the number of F atoms) of the etching reaction system. In this case, chemical species capturing excessive $F^*$ is $H^*$ dissociated and formed from $H_2$, $H_2S$ or silane base compound, or $Si^*$ dissociated and formed from silane base compound, etc. Namely, $F^*$ formed from sulfur fluoride is easily bonded to $H^*$ or silicon system chemical species formed from additive compound, and is then removed toward the outside of the system in the form of HF or $SiF_x$, etc. Accordingly, also in the case where, e.g., $S_2F_2$ having the highest S/F ratio of sulfur fluoride is used, a quantity of formation of halogen radical is further reduced to increase apparent S/F ratio. Thus, the condition advantageous to deposition of S is set.

Further, radical reaction is suppressed to some degree under such a low temperature state. By the above-described various effects, the etchrate of the refractory metal layer in the second etch-back process step is lowered to much more degree than that at the first etch-back process step. Accordingly, even if the upper surface of the insulating film is exposed, there is no possibility that the etchant abruptly concentrates into the through hole. Thus, the loading effect can be suppressed.

As is clear from the foregoing description, in accordance with the interconnection forming method of this invention, it is possible to carry out etch-back of the refractory metal layer formed by the blanket CVD process while extremely satisfactorily suppressing the loading effect, thus to form a plug having high reliability in a through hole opened in the interlayer insulating film. In addition, since the above-described etch-back is carried out by an ingenious or skillful technique to conduct switching between the high temperature process and the low temperature process within a single etching chamber, a large etching system is not required. Thus, there results a process advantageous from viewpoints of cost, throughput and prevention of contamination.

Accordingly, the interconnection forming method according to this invention is extremely useful for manufacturing a semiconductor device having high integration and high performance on the basis of a sophisticated design rule.

BRIEF DESCRIPTION OF THE DRAWINGS

FIGS. 1a and 1b are schematic cross sectional views for explaining the problems in a conventional interconnection forming method wherein FIG. 1a shows the state where a Blk-W layer is formed by the blanket CVD process, and FIG. 1b shows the state where the Blk-W layer in the through hole is eroded by the loading effect.

FIGS. 2a and 2b are schematic cross sectional views showing an example of the configuration of a wafer mount electrode and a peripheral member thereof of a magnetically enhanced microwave plasma etching system used for carrying out an interconnection forming method of this invention wherein FIG. 2a shows the state where a wafer is tightly held on the wafer mount electrode for implementation of a low temperature process, and FIG. 2b shows the state where a wafer is lifted by pins for implementation of a high temperature process.

FIGS. 3a to 3c are schematic cross sectional views showing an example of a process to which the interconnection forming method of this invention is applied in order of their process steps wherein FIG. 3a shows the state where a Blk-W layer is formed by the blanket CVD process, FIG. 3b shows the state where the first etch-back process step is completed, and FIG. 3c shows the state where the second etch-back process step is completed, so the trough hole is substantially planarly buried.

DETAILED DESCRIPTION OF THE INVENTION

This invention will now be described in detail in connection with actual embodiments.

Prior to description of an actual interconnection forming process, an example of the configuration of a wafer mount electrode of an etching system used for carrying out this invention and the device in use thereof will be first described with reference to FIGS. 2a and 2b. It is to be noted that while a magnetically enhanced microwave plasma etching system is taken as the above-mentioned etching system, the configuration of the wafer mount electrode and/or the device in use thereof can be applied to the case where other etching systems such as a parallel plates RIE (Reactive Ion Etching) system or a magnetron RIE system, etc. are used.

Figure 2A:
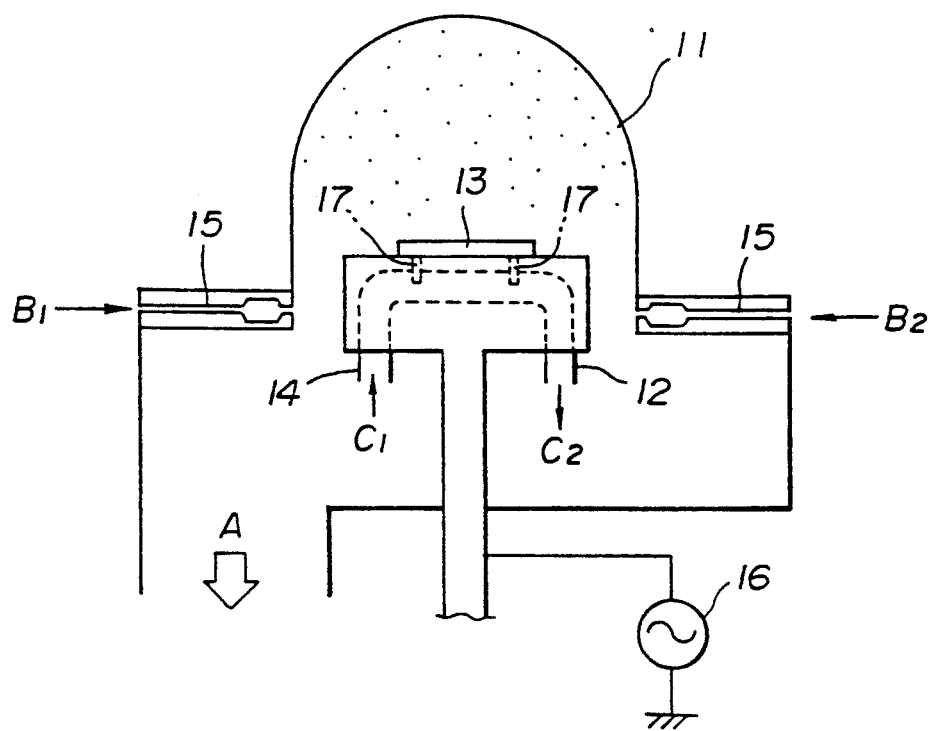
Figure 2B:
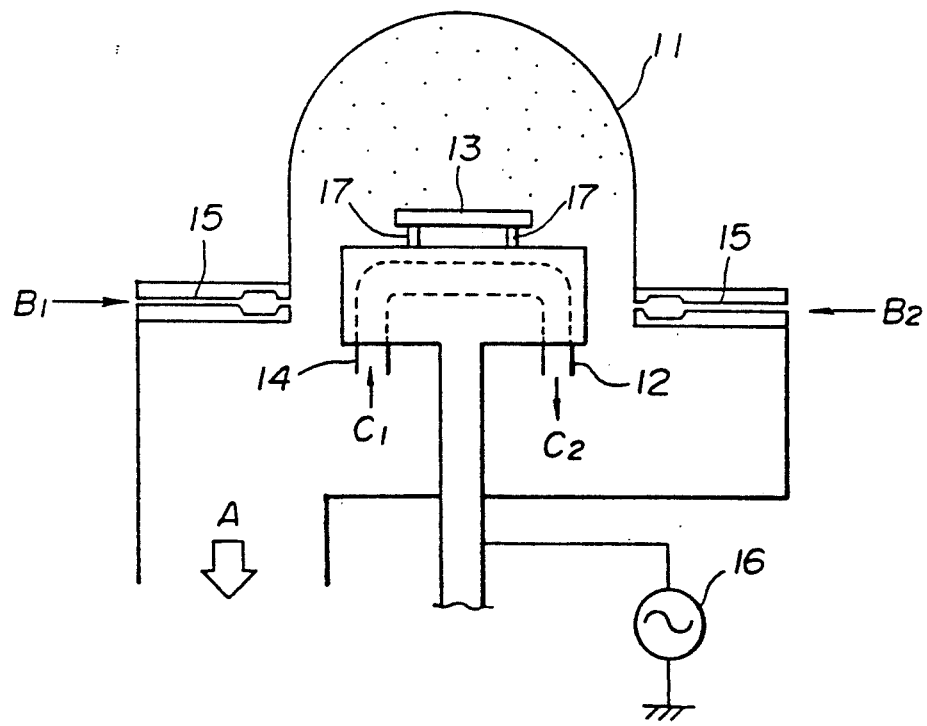

FIGS. 2a and 2b are schematic cross sectional views showing a wafer mount electrode of a magnetically enhanced microwave plasma etching system and a peripheral member thereof. This system is a system to carry out ECR discharge by making use of a microwave having a frequency of 2.45 GHz introduced through a waveguide (not shown) and a magnetic field having a magnetic flux density of $8.75 \times 10^{-2}$ T (=875 Gauss) applied from a solenoid coil (not shown) to generate high density plasma within a quartz bell jar 11, thus to carry out various processing by using this plasma. At the side wall portion of the bell jar 11, a gas conduit 15 for introducing gas necessary for processing from directions indicated by arrows $B_1$ and $B_2$ is provided. The internal spaced is high vacuum evacuated by a vacuum system (not shown) connected in a direction as indicated by an arrow A. Within the bell jar 11, a wafer mount electrode 12 for mounting thereon a wafer 13 serving as a substrate to be processed is accommodated. This wafer mount electrode 12 is grounded through a RF power supply 16 for applying a RF bias.

The configuration of a typical wafer mount electrode in a magnetically enhanced microwave plasma etching system has been described above. In the system used in this invention, in order to permit it to carry out low temperature etching, a cooling piping 14 is embedded in the wafer mount electrode 12 to introduce refrigerant or coolant from a cooling equipment such as a chiller, etc. arranged outside the system to circulate such a refrigerant in directions indicated by arrows $C_1$ and $C_2$ in the figure. In addition, although not shown, there may be mounted a backside purge mechanism and/or electrostatic chuck mechanism for preventing deposition onto the rear side of the wafer 13, or promoting thermal conduction between the wafer mounted electrode 12 and the wafer 13.

the device in use of the wafer mount electrode 12 resides in that the thermal contact state between the wafer 13 and the wafer mount electrode 12 is changed by moving upwardly or downwardly pins 17. Thus, it is possible to cope with both the low temperature process and the high temperature process by using a single etching chamber (bell jar 11 in this embodiment). Namely, in the case of carrying out the low temperature process, as shown in FIG. 2a, it is sufficient to hold the wafer 13 on the wafer mount electrode 12 in a manner in contact therewith to cool it. On the other hand, in the case of carrying out the high temperature process, as shown in FIG. 2b, it is sufficient to move upwardly the wafer 13 by means of the pins 17 to thermally isolate it from the cooling state of the wafer mount electrode 12. Thus, the temperature of the wafer 13 is rapidly elevated by plasma radiation heat and etching reaction heat.

It is to be noted that while pins ordinarily provided in order to obtain convenience of load/unload may be used as the pins 17 as they are, pins which can move to more degree in upper and lower directions may be specially provided in dependency upon the configuration of the wafer mount electrode 12, or by taking the heating efficiency into consideration.

PREFERRED EMBODIMENTS

Examples of actual processes using such a wafer mount electrode 12 will now be described.

Embodiment 1

This embodiment is directed to the example where a tungsten (W) layer formed by the blanket CVD process is etched back by using $SF_6$ at the first etch-back process step to such an extent that the underlying layer is not exposed thereafter to carry out etching of the remaining under low temperature state by using mixed gas of $SF_6$ and $Cl_2$ at the second etch-back process step. This process will now be described with reference to FIGS. 3a to 3c.

Figure 3A:
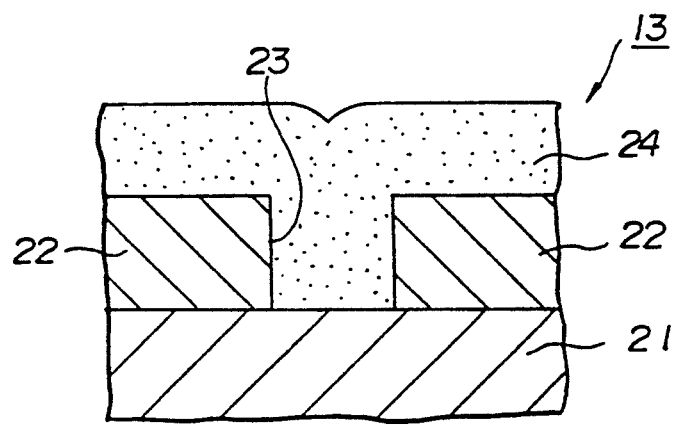

Initially, as an example, as shown in FIG. 3a, there was prepared a wafer 13 in which an interlayer insulating film 22 comprised of silicon oxide, etc. is formed on a semiconductor substrate 21 comprised of silicon, etc., and a Blk-W layer 24 is formed by the blanket CVD process in such a manner to allow that layer 24 to be buried into a through hole 23 opened in the interlayer insulating film 22 and to coat or cover the entire surface thereof. Here, the above-mentioned blanket CVD process was carried out by conducting nuclear growth for 20 seconds, e.g., under the condition where flow rate of $WF_6$ is 25 SCCM, flow rate of $SiH_4$ is 10 SCCM, gas pressure is 80 Torr, and wafer temperature is 475° C. thereafter to deposit W under the condition where flow rate of $WF_6$ is 60 SCCM and flow rate of $H_2$ is 360 SCCM.

Figure 3B:
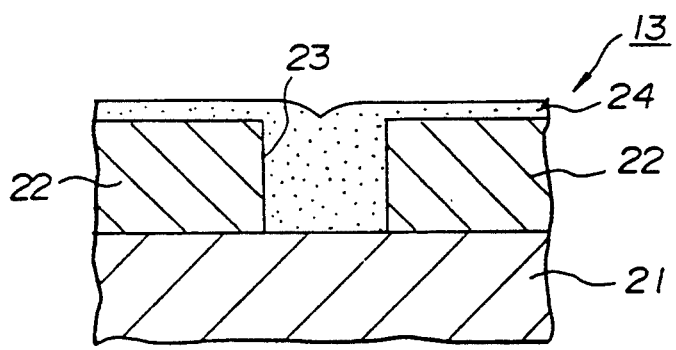

Then, the wafer 13 is set on the wafer mount electrode 12 of the magnetically enhanced plasma etching system to hold the wafer 13 in the state spaced from the wafer mount electrode 12 by using the pins 17 as shown in the previously mentioned FIG. 2b. It is to be noted that, also at this time, ethanol coolant is circulated in the cooling piping 14 embedded in the wafer mount electrode 12. In this state, the Blk-W layer 24 is etched back under the condition where flow rate of $SF_6$ is 100 SCCM, gas pressure is 1.3 Pa (10 m Torr), microwave power is 850 W, and RF bias power is 100 W (2 MHz), thus to remove about 90% of the film thickness thereof as shown in FIG. 3b. It should be here noted that the film thickness in this case indicates a film thickness at the portion on the upper surface of the interlayer insulating film 22.

At the first etch-back process step, etching was developed by the mechanism that radical reaction by F* formed in plasma by dissociation of $SF_6$ is assisted by ion such as $SF_x^+$, etc. Thus, the blk-W layer 24 is removed in the form of $WF_x$. Further, since the temperature of the wafer 13 for this time period is elevated by plasma radiation heat and etching reaction heat, the etching reaction is promoted by this temperature elevation, whereby the uniformness of etch-back is advantageously improved.

It is to be noted that since it is required to complete etching before the underlying interlayer insulating film 22 is exposed, it is desirable to measure etchrate in advance under the above-described condition to judge an etching amount on the basis of the time elapsed.

Figure 1A:
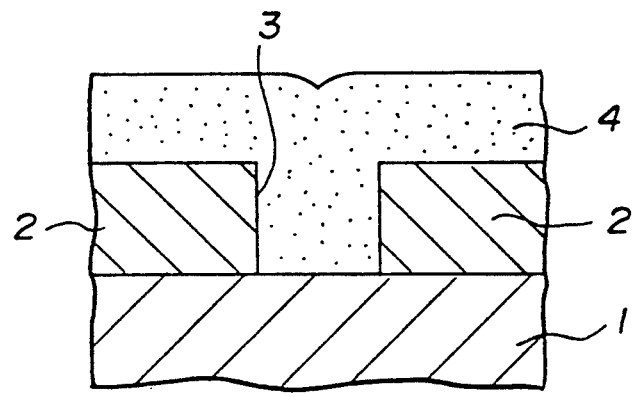
Figure 1B:
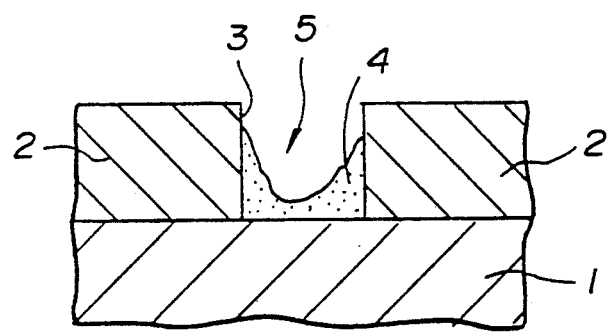
Figure 3C:
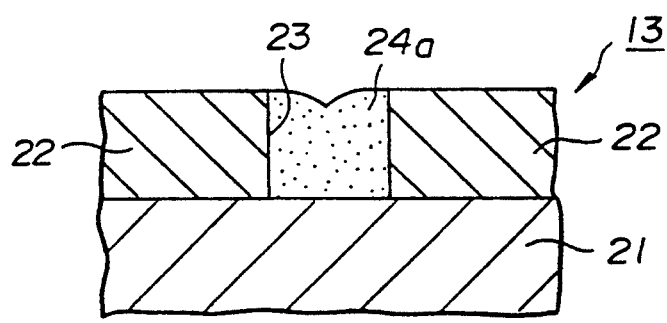

Then, the pins 17 were lowered as shown in FIG. 2a to hold the wafer 13 in contact with the wafer mount electrode 12 by jointly using the electrostatic chuck mechanism. In this state, etch-back of the remainder of the Blk-W layer 24 was carried out under the condition where flow rate of $RS_6$ is 30 SCCM, flow rate of $Cl_2$ is 20 SCCM, gas pressure is 1.3 Pa (10 m Torr), microwave power is 850 W, RF bias power is 100 W (2 MHz), and wafer temperature is $-30°$ C. When the upper surface of the interlayer insulating layer 22 is exposed as shown in FIG. 3c, etch-back was completed. Thus, the inner portion of the through hole 23 was buried or filled substantially planarly by the Blk-W layer 24. Thus, a W plug 24a was formed. Here, over-etching of about 5% was carried out, but any eroded portion 5 as shown in the previously mentioned FIG. 1b was not formed.

At the second etch-back process step, because of the fact that the radical reaction rate is lowered by low temperature cooling of the wafer 13, and the fact that deposition of $WCl_x$ and sputter removal thereof are competitive on the surface of the Blk-W layer 24 since the vapor pressure of $WCl_x$ serving as a reaction product of $Cl_2$ and W is low under such a low temperature, etc., the etchrate is lowered to much more degree than that at the first etch-back process step. Accordingly, even at the time point when the upper surface of the interlayer insulating film 22 is exposed, there is no possibility that radical such as $F^*$ or $Cl^*$, etc. abruptly concentrates on the Blk-W layer 24 buried in the through hole 23.

It is to be noted that switching between the high temperature process and the low temperature process is carried out by an extremely simple technique of upper and lower movement of the pins 17 included in the wafer mount electrode 12, thus maintaining constant the cooling state of the wafer mount electrode 12 at all times. Accordingly, it is not required to alter a set temperature of a chiller in the middle of process, or to convey a wafer to another chamber as in the prior art. Thus, etch-back excellent from respective viewpoints of cost, throughput, space efficiency, and prevention of contamination can be carried out.

Embodiment 2

This embodiment is directed to the example where a Blk-W layer formed by the blanket CVD process is etched back to such an extent that the underlying layer is not exposed by using $S_2F_2$ at the first etch-back process step thereafter to etch the remaining Blk-W layer under a low temperature state by using mixed gas in which $H_2$ is added to $S_2F_2$ at the second etch-back process step.

Initially, a wafer 13 in the same state as that shown in the previously mentioned FIG. 3a was set on the wafer mount electrode 12 of the magnetically enhanced microwave plasma etching system to hold the wafer 13 in the state spaced from the wafer mount electrode 12 by using pins 17 as shown in FIG. 2b. At this time, etch-back of the Blk-W layer 24 was carried out under the condition where flow rate of $S_2F_2$ is 20 SCCM, gas pressure is 1.3 Pa (10 mTorr), microwave power is 850 W, and RF bias power is 50 W (2 MHz), thus to remove about 90% of the film thickness thereof as shown in FIG. 3b.

At the first etch-back process step, etching is developed by the mechanism that the radical reaction by $F^*$ formed in plasma by dissociation of $S_2F_2$ is assisted by ion such as $S^+$, $S_2^+$ or $SF_x^+$, etc. Thus, the Blk-W layer 24 was rapidly removed in the form of $WF_x$.

Then, the pins 17 were caused to be lowered as shown in FIG. 2a to hold the wafer 13 in contact with the wafer mount electrode 12 by jointly using the electrostatic chuck mechanism. In this state, etch-back of the remainder of the Blk-W layer 24 was carried out under the condition where flow rate of $S_2F_2$ is 20 SCCM, flow rate of $H_2$ is 20 SCCM, gas pressure is 1.3 Pa (10 mTorr), microwave power is 850 W, RF bias power is 50 W(2 MHz), and wafer temperature is $-30°$ C. to complete etch-back when the upper surface of the interlayer insulating film 22 is exposed as shown in FIG. 3c. In this way, the internal portion of the through hole 23 is buried substantially planarly by the Blk-W layer 24. A W plug 24a is thus formed.

At the second etch-back process step, the radical reaction rate is lowered by the low temperature cooling of the wafer 13. Further, because the wafer 13 is subjected to low temperature cooling, S dissociated and formed from $S_2F_2$ can be deposited on the surface of the Blk-W layer 24. In addition, since excessive $F^*$ is consumed by $H^*$ formed from $H_2$, apparent S/F ratio of the etching system is increased. Thus, there results the condition where deposition of S is apt to occur. For these reasons, also in this embodiment, the etchrate at the second etch-back process step was lowered to much more degree than that at the first etch-back process step. Thus, the loading effect was prevented.

It is to be noted that while $S_2F_2$ is used as sulfur fluoride in this embodiment, even if other sulfur fluoride materials are used, etching may be developed by a mechanism substantially similar to the above.

Further, while $H_2$ is used as compound added into sulfur fluoride in this embodiment, even if $H_2S$ or silane gas is used, similar satisfactory results can be expected. In the case where $H_2S$ is used, since S can be delivered into the etching reaction system in addition to capture of $F^*$ by $H^*$, the S/F ratio can be further increased. As the silane compound, there are enumerated silicon hydride such as $SiH_4$, $Si_2H_6$ or $Si_3H_8$, etc., and partially halogenated derivative such as $SiH_2F_2$ or $SiH_2Cl_2$, etc. in which a portion or portions of hydrogen atoms are replaced by halogen atoms. Since these silane compounds can form $Si^*$ in addition to $H^*$ as the chemical species which can capture excessive $F^*$, the S/F ratio can be efficiently increased also in this case.

While this invention has been described in connection with the two embodiments, this invention is not limited to these respective embodiments by any means, but, for example, various additive gases may be mixed into etching gas. For example, rare gas such as He or Ar, etc. may be suitably added into etching gas used at the first and second etch-back process steps with a view to providing the sputtering effect, the cooling effect or the dilution effect.

What is claimed is:
1. An interconnection forming method comprising:

a process step of forming a refractory metal layer in a manner to coat the entire surface of an insulating film having a through hole opened therein to allow the inner portion of said through hole to be buried;

a first etch-back process step of etching said refractory metal layer immediately before at least a portion of the upper surface of said insulating film is exposed; and a second etch-back process step of etching the remainder of said refractory metal layer until the upper surface of said insulating film is successively exposed while coating a wafer within an etching chamber used at said first etch-back process step.

2. An interconnection forming method as set forth in claim 1, wherein said refractory metal layer is any one of a tungsten layer, a molybdenum layer, a tantalum, layer, and a titanium layer.

3. An interconnection forming method comprising:

a process step of forming a refractory metal layer in a manner to coat the entire surface of an insulating film having a through hole opened therein to allow the inner portion of said through hole to be buried;

a first etch-back process step of etching said refractory metal layer immediately before at least a portion of the upper surface of said insulating film is exposed by using an etching gas including at least one kind of sulfur fluoride selected from a compound group consisting of $S_2F_2$, $SF_2$, $SF_4$, $S_2F_{10}$ and $SF_6$; and a second etch-back process step of etching the remainder of said refractory metal layer until the upper surface of said insulating film is successively exposed while cooling a wafer within an etching chamber used in said first etch-back process step by using an etching gas including at least one kind of sulfur fluoride except for $SF_6$ selected from said compound group and any one kind of compound selected from $H_2$, $H_2S$ and silane compound.

4. An interconnection forming method as set forth in claim 3, wherein said refractory metal layer is a tungsten layer or a molybdenum layer.

* * * * *